US011396246B2

United States Patent
Oestreich et al.

(10) Patent No.: US 11,396,246 B2
(45) Date of Patent: Jul. 26, 2022

(54) ENERGY-CONSUMPTION DETECTION OF VEHICLES IN AN OFF STATE

(71) Applicant: Ford Global Technologies, LLC, Dearborn, MI (US)

(72) Inventors: Robert G. Oestreich, Farmington Hills, MI (US); David Celinske, Wolverine Lake, MI (US); John Anthony DeMarco, Lake Orion, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 674 days.

(21) Appl. No.: 16/160,080

(22) Filed: Oct. 15, 2018

(65) Prior Publication Data

US 2020/0114768 A1 Apr. 16, 2020

(51) Int. Cl.
| | |
|---|---|
| *B60L 15/20* | (2006.01) |
| *B60L 58/12* | (2019.01) |
| *G01R 21/133* | (2006.01) |
| *B60W 50/04* | (2006.01) |
| *G05B 19/042* | (2006.01) |

(Continued)

(52) U.S. Cl.
CPC .......... *B60L 58/12* (2019.02); *B60W 50/045* (2013.01); *G01R 21/133* (2013.01); *G01R 31/367* (2019.01); *G01R 31/382* (2019.01); *G05B 19/0425* (2013.01); *B60W 2050/0045* (2013.01);

(Continued)

(58) Field of Classification Search
CPC .. B60L 3/00; B60L 3/0046; B60L 3/12; B60L 15/2045; B60L 58/00; B60L 58/10; B60L 58/12; B60L 2240/70; B60R 16/023; B60W 50/04; B60W 50/045; B60W 2050/00; B60W 2050/0001; B60W 2050/0043; B60W 2050/0044; B60W 2050/0045; G05B 19/04; G05B 19/042; G05B 19/0421; G05B 19/0425; G05B 2219/00; G05B 2219/10; G05B 2219/1136; G05B 2219/26; G05B 2219/2637; G05B 2219/25; G05B 2219/25032; G01R 31/136; G01R 31/367; G01R 31/382; G01R 31/133; G01R 31/1331; H04L 12/40; H04L 12/40006; H04L 12/40013; H04L 12/40039; H04L 2012/40208; H04L 2012/40215; H04L 2012/40273; Y02T 10/64; Y02T 10/70; Y02T 10/72; Y02T 90/16
See application file for complete search history.

(56) References Cited

U.S. PATENT DOCUMENTS

| | | |
|---|---|---|
| 5,761,072 A | 6/1998 | Bardsley, Jr. et al. |
| 6,353,306 B1 | 3/2002 | Mixon |

(Continued)

*Primary Examiner* — Khoi H Tran
*Assistant Examiner* — Sarah A Tran
(74) *Attorney, Agent, or Firm* — Frank Lollo; Eversheds Sutherland (US) LLP

(57) ABSTRACT

Method and apparatus are disclosed for energy-consumption detection of vehicles in an off state. An example vehicle includes a controller area network (CAN) including CAN buses, a gateway module, and electronic control units (ECUs) that are each connected to one of the CAN buses. Upon activating while the vehicle is in an off state, a first of the ECUs sends a message via a corresponding one of the CAN buses to activate the gateway module. The message includes activation data and the gateway module stores the activation data.

16 Claims, 4 Drawing Sheets

(51) Int. Cl.
    *G01R 31/367*     (2019.01)
    *G01R 31/382*     (2019.01)
    *B60W 50/00*     (2006.01)

(52) U.S. Cl.
    CPC .............. *G05B 2219/25032* (2013.01); *G05B 2219/2637* (2013.01)

(56) References Cited

U.S. PATENT DOCUMENTS

| | | |
|---|---|---|
| 7,064,525 B2 | 6/2006 | Pachciarz et al. |
| 7,725,275 B2 | 5/2010 | Zhang et al. |
| 8,996,241 B2 | 3/2015 | Uchida |
| 10,197,631 B2 * | 2/2019 | Barfield, Jr ............ G07C 5/008 |
| 2010/0231037 A1 * | 9/2010 | Esaka ................... H02J 7/0032 |
| | | 307/9.1 |
| 2015/0120226 A1 * | 4/2015 | Tanabe ............... G01R 31/3648 |
| | | 702/63 |
| 2015/0184595 A1 * | 7/2015 | Honzawa .................. F02D 9/02 |
| | | 123/41.58 |
| 2016/0117868 A1 * | 4/2016 | Mitchell ................ G07C 5/008 |
| | | 701/32.3 |
| 2017/0026198 A1 * | 1/2017 | Ochiai .............. H04L 12/40039 |
| 2017/0174157 A1 * | 6/2017 | Deljevic ............. B60L 11/1861 |
| 2018/0232037 A1 * | 8/2018 | Darin ...................... B60L 58/10 |

* cited by examiner

| | 1 | 2 | 3 | 4 | 5 | 6 | 7 | 8 | 9 |
|---|---|---|---|---|---|---|---|---|---|
| | Energy Mgmt. Enabled (Key Off) Time | CAN Wake Count | Local CAN Wake Count | CAN Sleep Count | CAN Active Timer | NM_Active Timer | CPU-UP & CAN Sleep Timer | Energy Mgmt. Disabled (Key On) Time | Cadence at Energy Mgmt. Enabled |
| 1 | | | | | | | | | |
| 2 | | | | | | | | | |
| 3 | | | | | | | | | |
| ... | | | | | | | | | |
| 50 | | | | | | | | | |
| | | | | | | | | | |

FIG. 2

| | 1 | 2 | 4 | 6 |
|---|---|---|---|---|
| | Event ID | Time | Cadence | Cause |
| 1 | | | | |
| 2 | | | | |
| 3 | | | | |
| ... | | | | |
| 250 | | | | |
| | | | | |

FIG. 3

|   | 1 | 2 | 3 | 4 | 5 | 6 | 7 | 8 | 9 |
|---|---|---|---|---|---|---|---|---|---|
|   | Energy Mgmt. Enabled (Key Off) Time | CAN HS1 Active Timer | CAN HS2 Active Timer | CAN HS3 Active Timer | CAN MS1 Active Timer | CAN Wake From All Sleep | Energy Mgmt. Disabled (Key On) Time | Cadence at Energy Mgmt. Enabled |   |
| 1 |   |   |   |   |   |   |   |   |   |
| 2 |   |   |   |   |   |   |   |   |   |
| 3 |   |   |   |   |   |   |   |   |   |
| ... |   |   |   |   |   |   |   |   |   |
| 250 |   |   |   |   |   |   |   |   |   |
|   |   |   |   |   |   |   |   |   |   |

FIG. 4

|   | 1 | 2 | 3 | 4 | 5 | 6 |
|---|---|---|---|---|---|---|
|   | Event ID | Time | Ah | Cadence | Module ID | Cause |
| 1 |   |   |   |   |   |   |
| 2 |   |   |   |   |   |   |
| 3 |   |   |   |   |   |   |
| 4 |   |   |   |   |   |   |
| 5 |   |   |   |   |   |   |
| ... |   |   |   |   |   |   |
| 250 |   |   |   |   |   |   |
|   |   |   |   |   |   |   |

FIG. 5

ENERGY-CONSUMPTION DETECTION OF VEHICLES IN AN OFF STATE

TECHNICAL FIELD

The present disclosure generally relates to vehicles and, more specifically, to energy-consumption detection of vehicles in an off state.

BACKGROUND

Modern vehicles may include many electronic control units related to various vehicle functions (e.g., movement, power control, lighting, passenger comfort, etc.). These electronic control units oftentimes are communicatively coupled together via a communication bus to enable the electronic control units to issue commands, request information, and/or otherwise access data or information gathered from each other. In some instances, the communication bus is a controller area network (CAN) that provides for a multi-master data communication system.

SUMMARY

The appended claims define this application. The present disclosure summarizes aspects of the embodiments and should not be used to limit the claims. Other implementations are contemplated in accordance with the techniques described herein, as will be apparent to one having ordinary skill in the art upon examination of the following drawings and detailed description, and these implementations are intended to be within the scope of this application.

Example embodiments are shown for energy-consumption detection of vehicles in an off state. An example disclosed vehicle includes a controller area network (CAN) including CAN buses, a gateway module, and electronic control units (ECUs) that are each connected to one of the CAN buses. Upon activating while the vehicle is in an off state, a first of the ECUs sends a message via a corresponding one of the CAN buses to activate the gateway module. The message includes activation data and the gateway module stores the activation data.

In some examples, the activation data identifies a cause of the first of the ECUs being active while the vehicle is in the off state. In some examples, the activation data stored by the gateway module includes a module ID, an event ID, an event time, and an event cause. In some such examples, the event time includes a timestamp. In some such examples, the event time includes a cadence identifier.

In some examples, the gateway module is in a system sleep mode when the vehicle is in the off state and each of the ECUs connected to the CAN is in a respective ECU sleep mode. In some such examples, the gateway module wakes up from the system sleep mode into a system active mode in response to one of the ECUs connected to the first of CAN buses activating. In some such examples, a first of the CAN buses becomes inactive when the vehicle is in the off state and each of the ECUs connected to the first of the CAN buses has been in the respective ECU sleep mode for at least a predetermined period of time. Some such examples further include an ignition switch and a remote start system. In such examples, the vehicle is in the off state when the ignition switch is not in an on position or a start position and the remote start system is inactive. Further, some such examples further include an ignition control unit that detects a position of the ignition switch.

Some examples include a battery. In such examples, the ECUs include a body control module (BCM) configured to collect energy consumption measurements of the battery when the vehicle is in the off state. In such examples, the gateway module stores the energy consumption measurements. Some such examples further include a battery management system connected to the BCM. In such examples, the battery management system includes a battery sensor that is configured to measure the energy consumption measurements of the battery. Further, in some such examples, the gateway module collects the energy consumption measurements of the battery via the BCM and one of the CAN buses to which the BCM is connected when the corresponding one of the CAN buses is active. Further, some such examples further include a local area network (LIN) that connects the BCM to the gateway module. In such examples, the gateway module is configured to collect the energy consumption measurements of the battery via the BCM and the LIN when the one of the CAN buses connected to the BCM is active or inactive. In some such examples, the gateway module correlates the activation data and the energy consumption measurements to facilitate identification of at least one of the ECUs that is consuming a most amount of the battery when the vehicle is in the off state. In some such examples, the gateway module is configured to send the activation data and the energy consumption measurements to a remote server via a communication module when the vehicle is in an on state. In some such examples, the gateway module is configured to determine, based on the activation data and the energy consumption measurements, which of the ECUs is consuming a most amount of the battery when the vehicle is in the off state. Further, in some such examples, in response to determining that at least one of the ECUs is draining the battery, the gateway module presents an alert to a user via an interface module when the vehicle is in an on state.

In some examples, each of the ECUs is configured to store the corresponding activation data when the vehicle is in the off state and send the corresponding activation data when the vehicle is in an on state.

An example disclosed method for a vehicle including electronic control units (ECUs) and controller area network (CAN) buses includes sending, via the ECUs, messages to a gateway module when the ECUs are active and the vehicle is in an off state. The messages include activation data. The example disclosed method also includes activating the CAN buses connected to the ECUs responsive to the ECUs activating and storing the activation data via the gateway module to monitor activity of the CAN buses.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

FIG. 2 depicts activation data collected and stored by an electronic control unit when the vehicle of FIG. 1 is in an off state.

FIG. 3 depicts other activation data collected and stored by an electronic control unit when the vehicle of FIG. 1 is in an off state.

FIG. 4 depicts activation and energy-consumption data collected and stored by a gateway module.

FIG. 5 depicts other activation and energy-consumption data collected and stored by a gateway module.

DETAILED DESCRIPTION OF EXAMPLE EMBODIMENTS

Figure 1:
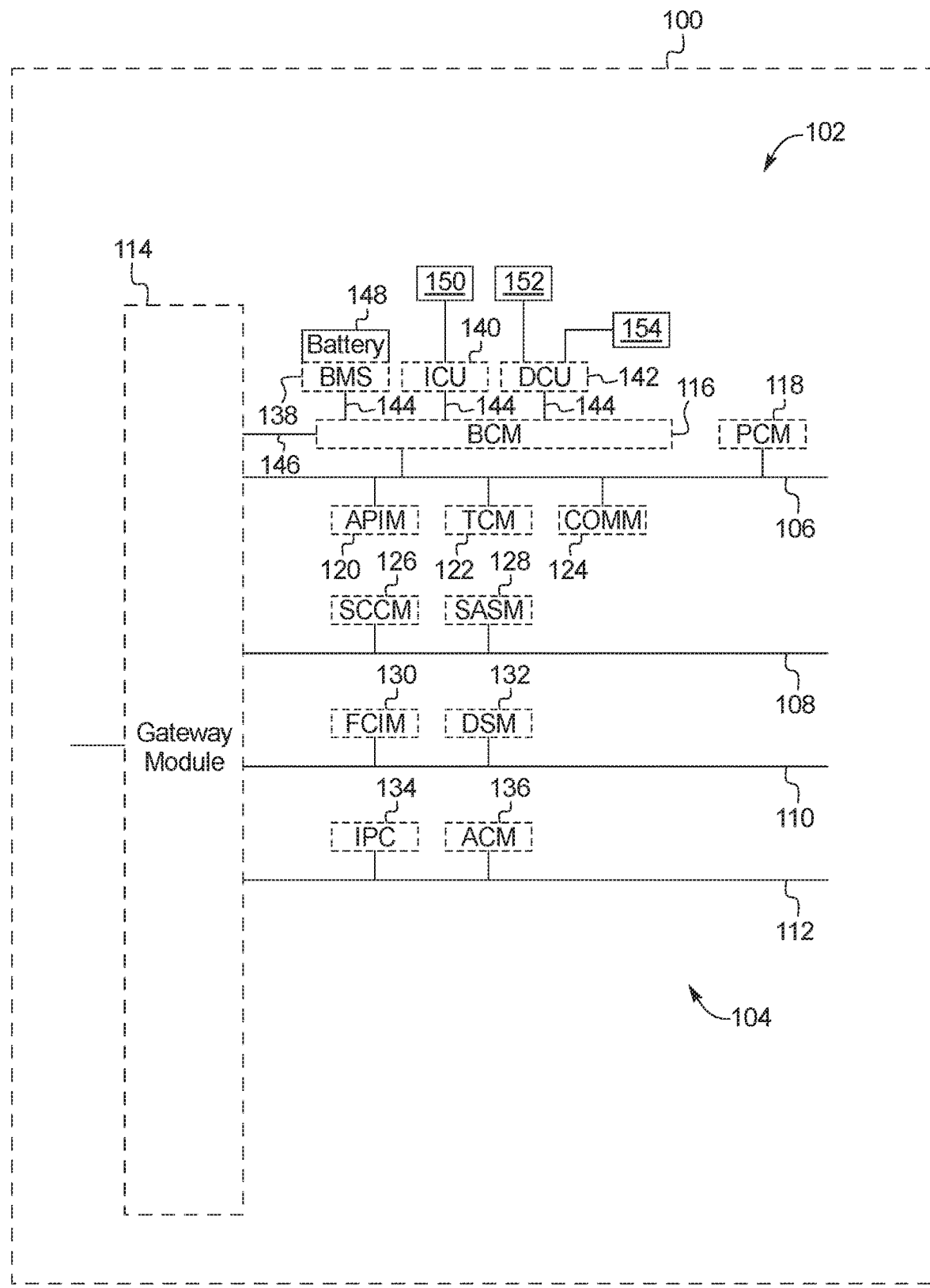
FIG. 1 is a block diagram of electronic components of an example vehicle in accordance with the teachings herein.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

Modern vehicles may include many electronic control units related to various vehicle functions (e.g., movement, power control, lighting, passenger comfort, etc.). These electronic control units oftentimes are communicatively coupled together via a communication bus to enable the electronic control units to issue commands, request information, and/or otherwise access data or information gathered from each other. In some instances, the communication bus is a controller area network (CAN) that provides for a multi-master data communication system.

In some instances, an electronic control unit may activate when a vehicle is in a key-off state (e.g., when an ignition switch is in an off position). The electronic control unit may draw energy from a starter battery of the vehicle. In some such instances, the electronic control unit potentially may drain the starter battery such that the starter batter is unable to start an engine when the vehicle attempts to transition to a key-on state. Oftentimes, a vehicle does not monitor activities of its various systems while in a key-off state, thereby potentially making it difficult to identify a source of battery drain while the vehicle is in a key-off state.

Example methods and apparatus disclosed herein detect a source of discharging a battery while a vehicle is in an off state by monitoring electronic control unit activity and battery usage while the vehicle is in an off state. Examples disclosed herein include a system that, when the vehicle is an on state, instructs electronic control units of the vehicle to collect activation data when the vehicle is in the off state. When the vehicle is in the off state, (1) electronic control units collect time-stamped and/or cadence-identified energy activation data and (2) a body control module collects energy consumption measurements (e.g., in Amp-Hours, as a state-of-charge) of the battery that are subsequently time-stamped and/or cadence-identified. A gateway module collects the energy consumption measurements and the activity data to detect a source of battery drainage while the vehicle is in the off state.

Turning to the figures, FIG. 1 illustrates an example vehicle 100 in accordance with the teachings herein. The vehicle 100 may be a standard gasoline powered vehicle, a hybrid vehicle, an electric vehicle, a fuel cell vehicle, and/or any other mobility implement type of vehicle. The vehicle 100 includes parts related to mobility, such as a powertrain with an engine, a transmission, a suspension, a driveshaft, and/or wheels, etc. The vehicle 100 may be non-autonomous, semi-autonomous (e.g., some routine motive functions controlled by the vehicle 100), or autonomous (e.g., motive functions are controlled by the vehicle 100 without direct driver input).

In the illustrated example, the vehicle 100 includes electrical components 102 that enable the vehicle 100 to operate. As illustrated in FIG. 1, the electrical components 102 include a controller area network (CAN) 104. As used herein, a CAN refers to a multi-master vehicle data communication system that incorporates a message-based protocol to enable electronic control units of a vehicle to communicate with each other. The CAN 104 of the illustrated example includes a plurality of CAN buses. Each of the CAN buses and, more generally, the CAN 104 are implemented in accordance with a controller area network (CAN) bus protocol, for example, as defined by International Standards Organization (ISO) 11898-1, a Media Oriented Systems Transport (MOST) bus protocol, a CAN flexible data (CAN-FD) bus protocol (ISO 11898-7) and/a K-line bus protocol (ISO 9141 and ISO 14230-1), and/or an Ethernet™ bus protocol IEEE 802.3 (2002 onwards), etc.

The CAN 104 of the illustrated example includes a CAN bus 106 (also referred to as a first CAN bus and a first bus), a CAN bus 108 (also referred to as a second CAN bus and a second bus), a CAN bus 110 (also referred to as a third CAN bus and a third bus), and a CAN bus 112 (also referred to as a fourth CAN bus and a fourth bus). In some examples, one or more of the CAN buses is a high-speed bus and/or one or more of the CAN buses is a mid-speed bus. For example, the CAN bus 106 is a first high-speed bus (also referred to as a first high-speed CAN bus), the CAN bus 108 is a second high-speed bus (also referred to as a second high-speed CAN bus), the CAN bus 110 is a mid-speed bus (also referred to as a mid-speed CAN bus), and the CAN bus 112 is a third high-speed bus (also referred to as a third high-speed CAN bus). High-speed buses are configured to transfer at rates greater than mid-speed buses. For example, high-speed buses have transfer rates of up to 1 megabit per second (1 Mbit/sec).

In the illustrated example, each of the CAN buses 106, 108, 110, 112 of the CAN 104 are connected to a gateway module 114. For example, the gateway module 114 is configured to function as an information bridge between the electrical components 102 (e.g., electronic control units, sensors, etc.), data buses (e.g., the CAN buses 106, 108, 110, 112), and/or other communication network(s) of the vehicle 100. Further, as disclosed in detail below, the gateway module 114 is configured to function as a central diagnostic interface for the vehicle 100. For example, the gateway module 114 collects and stores diagnostics information of the vehicle 100 and is communicatively connected to an on-board diagnostics (OBD) port of the vehicle 100 to facilitate a technician in retrieving the diagnostics information.

Further in the illustrated example, electronic control units (ECUs) are connected to the CAN buses 106, 108, 110, 112. That is, each of the ECUs is connected to one of the CAN buses 106, 108, 110, 112 of the CAN 104. ECUs are configured to monitor and control the subsystems of the vehicle 100. For example, the ECUs are discrete sets of electronics that include their own circuit(s) (e.g., integrated circuits, microprocessors, memory, storage, etc.) and firmware, sensors, actuators, and/or mounting hardware. In the illustrated example, the ECUs are configured to communicate and exchange information via the CAN 104. For example, the ECUs may communicate properties (e.g., status of the ECUs, sensor readings, control state, error and diagnostic codes, etc.) to and/or receive requests from each other. In some examples, the vehicle 100 has dozens of the ECUs that are positioned in various locations around the vehicle 100 and are communicatively coupled by the CAN 104.

The ECUs of the vehicle 100 in the illustrated example include a body control module (BCM) 116, a power control module (PCM) 118, an accessory protocol interface module (APIM) 120, a transmission control module (TCM) 122, a communication module 124, a system center configuration manager (SCCM) 126, a steering angle sensor module (SASM) 128, a front control interface module (FCIM) 130, a driver's seat module (DSM) 132, an instrument panel cluster (IPC) 134, and an active control mount (ACM) 136. For example, the body control module 116, the power control module 118, the accessory protocol interface module 120, the transmission control module 122, and the communication module 124 are connected to the CAN bus 106. The system center configuration manager 126 and the steering angle sensor module 128 are connected to the CAN bus 108. The front control interface module (FCIM) 130 and the driver's seat module (DSM) 132 are connected to the CAN bus 110. Further, the instrument panel cluster 134 and the active control mount 136 are connected to the CAN bus 112. In other examples, the vehicle 100 may include more, less, and/or different ECUs. Further, each of the ECUs may be connected to different CAN buses of the CAN 104.

The body control module 116 controls one or more subsystems throughout the vehicle 100. For example, the body control module 116 includes circuits that drive one or more of relays (e.g., to control wiper fluid, etc.), brushed direct current (DC) motors (e.g., to control wipers, etc.), stepper motors, LEDs, etc. The body control module 116 of the illustrated example is communicatively connected to other ECUs to control corresponding subsystems of the vehicle 100. For example, the body control module 116 is communicatively connected to a battery management system (BMS) 138, an ignition control unit (ICU) 140, and one or more door control units (DCUs) 142. In the illustrated example, each of the battery management system 138, the ignition control unit 140, and the door control unit 142 is communicatively connected to the body control module 116 via a respective local area network (LIN) 144. As used herein, a LIN refers to a single-master vehicle data communication system that incorporates that enable electrical devices of a vehicle to communicate with each other. Further, as illustrated in FIG. 1, the body control module 116 is connected to the gateway module 114 via another local area network (LIN) 146. In other examples, the battery management system 138 is connected directly to the gateway module 114 via the LIN 146 and/or another LIN.

In the illustrated example, the battery management system 138 connected to the body control module 116 includes a battery sensor that is configured to collect energy consumption measurements of a battery 148 of the vehicle 100 (e.g., in Amp-Hours, as a state-of-charge). That is, the body control module 116 is configured to collect energy consumption measurements of the battery 148 via the battery management system 138. The battery 148 is, for example, a starter battery that provides energy to activate an engine and/or the electrical components 102 of the vehicle 100.

The ignition control unit 140 includes and/or is communicatively connected to an ignition switch sensor 150 that monitors a position (a key-on position, a key-off position, a start position, an accessory position) of an ignition switch of the vehicle 100. That is, the ignition control unit 140 detects the position of the ignition switch via the ignition switch sensor 150, and the body control module 116 detects the position of the ignition switch via the ignition control unit 140.

Further, the door control unit 142 controls one or more subsystems of doors of the vehicle 100, such as power windows, power locks, power mirrors, etc. For example, the door control unit 142 includes circuits that drive one or more of relays, brushed direct current (DC) motors, stepper motors, LEDs, etc. In the illustrated example, the door control unit 142 is communicatively coupled to a keypad 152 and a proximity sensor 154. The keypad 152 includes buttons for receiving a code from a user. For example, the buttons (e.g., numeric buttons, alphabetic buttons, alphanumeric buttons) for receiving a code from a user, for example, to unlock the doors, open the doors, start the engine, etc. The proximity sensor 154 (e.g., a radar sensor, a lidar sensor, an ultrasonic sensor, a capacitive sensor) is configured to detect a presence of a user to enable a hands-free system (e.g., a hands-free liftgate system) to open door(s) an/or a liftgate of the vehicle 100 when the user is near the vehicle 100. The door control unit 142 is communicatively coupled to the keypad 152 and the proximity sensor 154 such that the door control unit 142 is configured to collect a code entered via the keypad 152 and detect when a user is near the proximity sensor 154. Further, the body control module 116 is communicatively coupled to the door control unit 142 such that the body control module 116 is configured to collect a code entered via the keypad 152 and detect when a user is near the proximity sensor 154.

In the illustrated example, the power control module 118 is an ECU that is configured to convert power and/or adjust an electrical voltage associated with the power. The accessory protocol interface module 120 is an ECU that is configured to control operation of an infotainment system of the vehicle 100. For example, the accessory protocol interface module 120 controls operation of a center console display (e.g., a liquid crystal display (LCD), an organic light emitting diode (OLED) display, a flat panel display, a solid state display, etc.). The accessory protocol interface module 120 includes hardware (e.g., a processor or controller, memory, storage, etc.) and software (e.g., an operating system, etc.) for an infotainment system (e.g., SYNC® and/or MyFord Touch® by Ford®) Further, the transmission control module 122 is an ECU that is configured to control operation of a transmission of the vehicle 100.

The communication module 124 includes wired or wireless network interfaces to enable communication with external networks. The communication module 124 also includes hardware (e.g., processors, memory, storage, antenna, etc.) and software to control the wired or wireless network interfaces. In the illustrated example, the communication module 124 includes one or more communication controllers for cellular networks (e.g., Global System for Mobile Communications (GSM), Universal Mobile Telecommunications System (UMTS), Long Term Evolution (LTE), Code Division Multiple Access (CDMA)), Near Field Communication (NFC) and/or other standards-based networks (e.g., WiMAX (IEEE 802.16m), local area wireless network (including IEEE 802.11 a/b/g/n/ac or others), Wireless Gigabit (IEEE 802.11ad), etc.). In some examples, the communication module 124 includes a wired or wireless interface (e.g., an auxiliary port, a Universal Serial Bus (USB) port, a Bluetooth® wireless node, etc.) to communicatively couple with a mobile device (e.g., a smart phone, a wearable, a smart watch, a tablet, a key fob, etc.). In such examples, the vehicle 100 may communicate with the external network via the coupled mobile device. The external network(s) may be a public network, such as the Internet; a private network, such as an intranet; or combinations thereof, and may utilize a variety of networking protocols now available or later developed including, but not limited to, TCP/IP-based networking protocols.

Further, in the illustrated example, the system center configuration manager 126 is an ECU configured to manage security of the electrical components 102 of the vehicle 100. The steering angle sensor module 128 is an ECU configured to monitor a position angle and a rate-of-turn of a steering wheel of the vehicle 100. The front control interface module 130 is an ECU configured to control operation of a front interface of the vehicle. The driver's seat module 132 is an ECU configured to control operation of one or more subsystems of a driver's seat of the vehicle. The instrument panel cluster 134 is an ECU configured to control operation of input device(s) and/or output device(s) of an instrument panel of the vehicle 100 to receive input from and/or to display information to the user. Input devices include, for example, a control knob, an instrument panel, a digital camera for image capture and/or visual command recognition, a touch screen, an audio input device (e.g., cabin microphone), buttons, or a touchpad. Output devices may include dials, lighting devices, etc. The active control mount 136 is an ECU configured to absorb vibration vehicle vibrations by dampening harmonics caused by the engine of the vehicle 100.

In operation, ECU activity and energy consumption of the battery are monitored while the vehicle 100 is in an off state (also referred to as a key-off state) to detect whether and which of the ECUs are draining the battery of the vehicle 100 when the vehicle 100 is in the off state (i.e., which of the ECUs is consuming a most amount of energy of the battery). For example, the vehicle 100 is in an off state when (1) the ignition switch sensor 150 detects that the ignition switch is not in an on position or a start position (e.g., the ignition switch is not in an off position or an accessory position) and (2) a remote start system of the vehicle 100 is inactive. A remote start system refers to a system of a vehicle that activates ignition of an engine of the vehicle upon receiving a start signal from a mobile device at a remote location (e.g., from within a house, a driveway, a parking lot, an office building, etc.).

In response to an ECU activating when the vehicle 100 is an off state, the ECU collects activation data that identifies a cause of the ECU activating while the vehicle is in the off state. In the illustrated example, the ECU includes the activation data in a network management (NM) message. Additionally or alternatively, the ECU is configured to include the activation data in any other type of message. The ECU sends the message to the gateway module 114 via a corresponding one of the CAN buses 106, 108, 110, 112 to active the gateway module 114 into a system active mode. For example, if the accessory protocol interface module 120 activates while the vehicle 100 is in an off state, the accessory protocol interface module 120 sends a network management message to the gateway module 114 via the CAN bus 106. Similarly, if the system center configuration manager 126 activates while the vehicle 100 is in an off state, the system center configuration manager 126 sends a network management message to the gateway module 114 via the CAN bus 108. Upon receiving a network management message when the vehicle 100 is in the off state, the gateway module 114 stores the corresponding activation data for subsequent analysis. Additionally or alternatively, an ECU stores the corresponding activation data while the vehicle is in the off state. In such examples, the ECU sends the activation data to the gateway module 114 after the vehicle subsequently transitions to an on state.

In the illustrated example, the gateway module 114 is configured to be in a system sleep mode when (1) the vehicle 100 is in the off state and (2) each of the ECUs connected to the CAN 104 has been in in a respective ECU sleep mode for a predetermined period of time. For example, an ECU transitions to its sleep mode when the ECU has been inactive for a predefined period of time and transitions to its active mode upon performing an activity. Further, a CAN bus (e.g., the CAN bus 106, the CAN bus 108, the CAN bus 110, the CAN bus 112) becomes inactive when the vehicle 100 is in the off state and each of the ECUs connected to the CAN bus has been in its respective ECU sleep mode for at least a predetermined period of time. A CAN bus becomes active when one of the corresponding ECUs sends a message (e.g., a network management message) along the CAN bus. For example, the CAN bus 108 becomes inactive when (1) the vehicle 100 is in the off state and (2) the system center configuration manager 126 and the steering angle sensor module 128 have been in a sleep mode for a predetermined period of time. The CAN bus 108 becomes active when the system center configuration manager 126 and/or the steering angle sensor module 128 sends a network management message to the gateway module 114 via the CAN bus 108.

When the vehicle 100 is in the off state, the gateway module 114 of the illustrated example is configured to collect and store an energy consumption measurement of the battery 148 from the battery management system 138 and/or the body control module 116 upon receiving a network management message from an ECU. When the CAN bus 106 to which the body control module 116 is connected is active, the gateway module 114 is configured to collect the energy consumption measurements of the battery 148 via the body control module 116 and the CAN bus 106. When the CAN bus 106 to which the body control module 116 is connected is inactive and/or active, the gateway module 114 is configured to collect the energy consumption measurements of the battery 148 via the body control module 116 and the LIN 146. The activation data and the energy-consumption data are timestamped and/or synchronized via a cadence identifier to enable the energy consumption measurements to be correlated with activity events that consumed the most energy from the battery 148 to facilitate identification of a drain source of the battery 148 (e.g., one or more of the ECUs) when the vehicle is in an off state. For example, the gateway module 114 is configured to correlate the activation data and the energy-consumption data based on timestamps and/or cadence identifiers to facilitate identification of one or more of the ECUs that are draining the battery to a discharged state when the vehicle 100 is in the off state.

Additionally or alternatively, the gateway module 114 is configured to determine is configured to collect and store an energy consumption measurement of the battery 148 from the battery management system 138 and/or the body control module 116 upon determining that the CAN 104 is active. In such examples, the gateway module 114 is configured to identify when the CAN 104 is active without receiving activation data from one of the ECUs. For example, when the CAN bus 106 to which the body control module 116 is connected is active, the gateway module 114 is configured to collect the energy consumption measurements of the battery 148 via the body control module 116 and the CAN bus 106. When the CAN bus 106 to which the body control module 116 is connected is inactive and/or active, the gateway module 114 is configured to collect the energy consumption measurements of the battery 148 via the body control module 116 and the LIN 146. The energy-consumption data is timestamped and/or synchronized with a cadence identifier to facilitate identification of when the battery 148 (e.g., one or more of the ECUs) is being drained of energy when the vehicle is in an off state.

Further, in some examples, the gateway module 114 is configured to send the activation data and the energy-consumption data to a remote server via the communication module 124 to facilitate a technician in diagnosing activity of the vehicle 100 from a remote location. For example, the gateway module 114 is configured to send the activation data and the energy-consumption data to a remote server via the communication module 124 after the vehicle 100 has transition to the on state to conserve energy consumption while the vehicle 100 is in the off state. Further, in some examples, the gateway module 114 is configured to (1) wake up the vehicle 100 into the on state and (2) send the activation data and the energy-consumption data to a remote server via the communication module 124 in response to detecting that the measured energy consumption exceeds a threshold (e.g., 20% of battery power of the battery 148) during a predefined period of time (e.g., 2 hours). Additionally or alternatively, the gateway module 114 is configured to determine, based on the activation data and the energy-consumption data, which, if any, of the ECUs is draining the battery 148 to a discharged state when the vehicle 100 is in the off state. For example, in response to determining that one or more of the ECUs is draining the battery 148 to a discharged state, the gateway module 114 presents an alert to a user via an interface module (e.g., the accessory protocol interface module 120, the front control interface module 130, the instrument panel cluster 134) when the vehicle is in the on state.

FIG. 2 depicts activation data 200 in the form of tally data collected and stored by a corresponding ECU when the vehicle 100 is in an off state. The tally data is collected to prevent recording data collected that corresponds with short durations during which the vehicle is in the off state (e.g., while refueling the vehicle, during a quick errand, etc.). For example, if the time period during which the tally data does not exceed a threshold duration (e.g., 30 minutes, 1 hour, 5 hours, etc.) that set of tally data is discarded from subsequently analysis of energy consumption. In the illustrated example, the activation data 200 is arranged in a table in which each row corresponds with a point in time at which the vehicle is in an off state. Further, each column corresponds with a type of activation data that is collected for that point in time. For example, a first column identifies a time at which an energy management system of the vehicle 100 is enabled. That is, the first column identifies when the vehicle 100 is set in an off state. The second column identifies a CAN wake count, the third column identifies a local CAN wake count (e.g., when a local CAN wakes itself and wakes up the CAN network), the fourth column identifies a CAN sleep count, the fifth column identifies a CAN active timer (e.g., when an ECU is CAN active), the sixth column identifies an active timer for the network management system (e.g., when an ECU is transmitting an NM message), and the seventh column identifies a CPU-UP and CAN sleep timer. The eighth column identifies a time that the energy management system is disabled. That is, the eighth column identifies a time in which the vehicle 100 transitions to an on state. Further, the ninth column identifies a cadence at which the energy management system is enabled.

FIG. 3 depicts other activation data 300 in the form of log data that is collected and stored by a corresponding ECU when the vehicle 100 is in an off state. In the illustrated example, the activation data 300 is arranged in a table in which each row corresponds with an event that activates an ECU and/or keeps an ECU active while the vehicle is in an off state. Further, each column corresponds with a type of activation data that is collected for each event. For example, a first column identifies an event ID (e.g., a "network sleep" event, a "wake" event, a "wake confirmed" event for which an ECU self-identified with high confidence that it woke the network, etc.), a second column identifies a time corresponding with the event (e.g., a timestamp), a third column identifies a cadence (e.g., a cadence identifier) corresponding with the event, and a fourth column identifies a cause of the event occurring (e.g., the keypad 152 receiving a code, the proximity sensor 154 detecting a user for a hands-free system, etc.).

FIG. 4 depicts data 400 including activation data of ECU(s) in the form of tally data that is collected and stored by the gateway module 114. The tally data is collected to prevent recording data collected that corresponds with short durations during which the vehicle is in the off state (e.g., while refueling the vehicle, during a quick errand, etc.). For example, if the time period during which the tally data does not exceed a threshold duration, that set of tally data is discarded from subsequently analysis of energy consumption. The activation data of the data 400 is collected by the gateway module 114 from ECU(s) while the vehicle 100 is in an off state and/or after the vehicle 100 awakens from an off state. In the illustrated example, the data 400 is arranged in a table in which each row corresponds with a point in time at which the vehicle is in an off state. Further, each column corresponds with a type of activation data that is collected for that point in time. For example, a first column identifies a time at which an energy management system of the vehicle 100 is enabled. That is, the first column identifies when the vehicle 100 is set in an off state. The second column identifies when the CAN bus 106 is active, the third column identifies when the CAN bus 108 is active, the fourth column identifies when the CAN bus 112 is active, the fifth column identifies when the CAN bus 110 is active, and the sixth column identifies when the CAN 104 awakens from a system sleep mode. The seventh column identifies a time that the energy management system is disabled. That is, the seventh column identifies a time in which the vehicle 100 transitions to an on state. Further, the eighth column identifies a cadence at which the energy management system is enabled.

FIG. 5 depicts other data 500 including activation data of ECU(s) and energy-consumption data of the battery 148 in the form of log data that is collected and stored by the gateway module 114. For example, the activation data of the data 500 is collected by the gateway module 114 from ECU(s) while the vehicle 100 is in an off state and/or after the vehicle 100 awakens from an off state. Further, the energy-consumption data of the data 500 is collected from the body control module 116 while the vehicle 100 is in an off state and/or after the vehicle 100 awakens from an off state. In the illustrated example, the data 500 is arranged in a table in which each row corresponds with an event that activates an ECU and/or keeps an ECU active while the vehicle is in an off state. Further, each column corresponds with a type of activation data and/or energy consumption event that is collected for each event. For example, a first column identifies an event ID (e.g., a "network sleep" event, a "wake" event, a "wake confirmed" event for which an ECU self-identified with high confidence that it woke the network, etc.), a second column identifies a time (e.g., a timestamp) corresponding with the event, a third column an energy consumption measurement (e.g., in Amp-Hours, as a state-of-charge) measured by the battery management system 138 that corresponds with the event, a fourth column identifies a cadence (e.g., a cadence identifier) corresponding with the event, a fifth column identifies the ECU corresponding with the event, and a sixth column identifies a cause of the event occurring (e.g., the keypad 152 receiving a code, the proximity sensor 154 detecting a user for a hands-free system, etc.).

Figure 6:
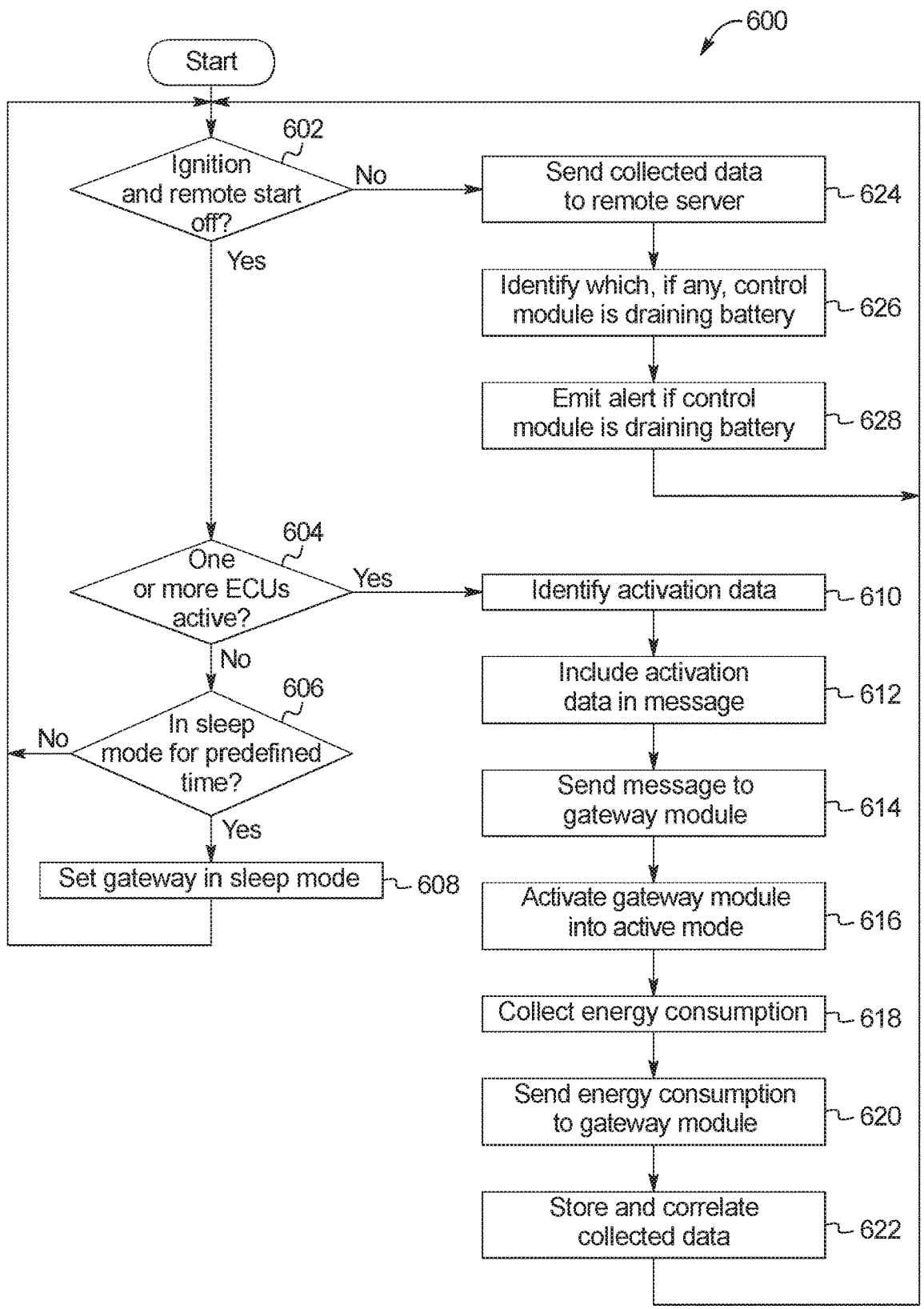
FIG. 6 is a flowchart for collecting activation and energy-consumption data when a vehicle is in an off state in accordance with the teachings herein.

FIG. 6 is a flowchart of an example method 600 to collect activation and energy-consumption data when a vehicle is in an off state. The flowchart of FIG. 6 is representative of machine readable instructions that are stored in memory and include one or more programs that are executed by a processor.

The processor may be any suitable processing device or set of processing devices such as, but not limited to, a microprocessor, a microcontroller-based platform, an integrated circuit, one or more field programmable gate arrays (FPGAs), and/or one or more application-specific integrated circuits (ASICs). The memory may be volatile memory (e.g., RAM including non-volatile RAM, magnetic RAM, ferroelectric RAM, etc.), non-volatile memory (e.g., disk memory, FLASH memory, EPROMs, EEPROMs, memristor-based non-volatile solid-state memory, etc.), unalterable memory (e.g., EPROMs), read-only memory, and/or high-capacity storage devices (e.g., hard drives, solid state drives, etc.). In some examples, the memory includes multiple kinds of memory, particularly volatile memory and non-volatile memory.

The memory is computer readable media on which one or more sets of instructions, such as the software for operating the methods of the present disclosure, can be embedded. The instructions may embody one or more of the methods or logic as described herein. For example, the instructions reside completely, or at least partially, within any one or more of the memory, the computer readable medium, and/or within the processor during execution of the instructions.

The terms "non-transitory computer-readable medium" and "computer-readable medium" include a single medium or multiple media, such as a centralized or distributed database, and/or associated caches and servers that store one or more sets of instructions. Further, the terms "non-transitory computer-readable medium" and "computer-readable medium" include any tangible medium that is capable of storing, encoding or carrying a set of instructions for execution by a processor or that cause a system to perform any one or more of the methods or operations disclosed herein. As used herein, the term "computer readable medium" is expressly defined to include any type of computer readable storage device and/or storage disk and to exclude propagating signals.

While the example program is described with reference to the flowchart illustrated in FIG. 6, many other methods may alternatively be used. For example, the order of execution of the blocks may be rearranged, changed, eliminated, and/or combined to perform the method 600. Further, because the method 600 is disclosed in connection with the components of FIGS. 1-5, some functions of those components will not be described in detail below.

Initially, at block 602, the gateway module 114 determines whether the ignition and the remote start system of the vehicle 100 are in an off state. In response to determining that the ignition and the remote start system are off, the method 600 proceeds to block 604 at which the gateway module 114 determines whether one or more of the ECUs of the vehicle 100 are in an active mode. In response to the gateway module 114 determining that none of the ECUs are in a CAN active mode, the method 600 proceeds to block 606.

At block 606, the gateway module 114 determines whether all of the ECUs have been in a respective ECU sleep mode for a predetermined period of time. In response to the gateway module 114 determining that not all of the ECUs have been in a respective ECU sleep mode for the predetermined period of time, the method 600 returns to block 602. Otherwise, in response to the gateway module 114 determining that all of the ECUs have been in a respective ECU sleep mode for the predetermined period of time, the method 600 proceeds to block 608 at which the gateway module 114 sets itself in a system sleep mode. Upon completing block 608, the method 600 returns to block 602.

Returning to block 604, in response to the gateway module 114 determining that at least one of the ECUs is in an ECU active mode, the method 600 proceeds to block 610. At block 610, the ECU(s) that are active identify corresponding activation data that identifies a cause for being active while the vehicle 100 is in an off state. At block 612, the ECU(s) that are active include the activation data in corresponding network management message(s). At block 614, the ECU(s) that are active send the corresponding network management message(s) to the gateway module 114 via one or more of the CAN buses 106, 108, 110, 112. At block 616, upon receiving one or more network management message, the gateway module 114 wakes itself into and/or remains in a system active mode. At block 616, the body control module 116 collects energy consumption measurements of the battery 148 via the battery management system 138. At block 620, the body control module 116 sends the energy consumption measurements to the gateway module 114 via the CAN bus 106 and/or the LIN 146. At block 622, the gateway module 114 stores and correlates the collected activation data and the collected energy-consumption data to facilitate a technician in later identifying a battery drain source. Upon completing block 622, the method returns to block 602.

At block 602, the method 600 proceeds to block 624 in response to the gateway module 114 determining that the ignition and the remote start system are not off. At block 624, when the vehicle 100 is in an on state, the communication module 124 sends the correlated data to a remote server to facilitate a technician in later identifying a battery drain source from a remote location. At block 626, when the vehicle 100 is in an on state, the gateway module 114 identifies, based on the correlated data, which, if any, of the ECUs is a battery drain source when the vehicle is in an off state. At block 628, the gateway module 114 emits an alert that identifies which, if any, of the ECUs is a battery drain source.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects. Further, the conjunction "or" may be used to convey features that are simultaneously present instead of mutually exclusive alternatives. In other words, the conjunction "or" should be understood to include "and/or". The terms "includes," "including," and "include" are inclusive and have the same scope as "comprises," "comprising," and "comprise" respectively. Additionally, as used herein, the terms "module" and "unit" refer to hardware with circuitry to provide communication, control and/or monitoring capabilities. A "module" and a "unit" may also include firmware that executes on the circuitry.

The above-described embodiments, and particularly any "preferred" embodiments, are possible examples of implementations and merely set forth for a clear understanding of the principles of the invention. Many variations and modifications may be made to the above-described embodiment(s) without substantially departing from the spirit and principles of the techniques described herein. All modifications are intended to be included herein within the scope of this disclosure and protected by the following claims.

What is claimed is:

1. A vehicle comprising:
    a battery;
    a controller area network (CAN) including CAN buses;
    a gateway module configured to detect a source of battery drainage while the vehicle is in the off state;
    electronic control units (ECUs) that are each connected to one of the CAN buses, wherein, upon activating while the vehicle is in an off state, a first of the ECUs sends a message via a corresponding one of the CAN buses to activate the gateway module, the message includes time-stamped activation data and the gateway module stores the activation data; and
    an ignition switch and a remote start system, wherein the vehicle is determined to be in the off state based on the ignition switch not being in an on position or a start position and the remote start system being inactive,
    wherein the ECUs include a body control module (BCM) configured to collect energy consumption measurements of the battery that are subsequently time-stamped, when the vehicle is in the off state,
    wherein the gateway module correlates the time-stamped activation data and the energy consumption measurements that are subsequently time-stamped to facilitate identification of at least one of the ECUs that is consuming a most amount of energy of the battery when the vehicle is in the off state, and
    wherein the vehicle is woken up into an on state, wherein the ignition switch is not in the on position or the start position, and the gateway module sends the time-stamped activation data and the energy consumption measurements to a remote server in response to detecting that the energy consumption measurements exceeds a threshold during a predefined period of time,.

2. The vehicle of claim 1, wherein the activation data identifies a cause of the first of the ECUs being active while the vehicle is in the off state.

3. The vehicle of claim 1, wherein the activation data stored by the gateway module includes a module ID, an event ID, an event time, and an event cause, and wherein the event ID comprises at least one of a network sleep event, a wake event, or a wake confirmed event.

4. The vehicle of claim 3, wherein the event time includes a timestamp.

5. The vehicle of claim 1, wherein the gateway module is in a system sleep mode when the vehicle is in the off state and each of the ECUs connected to the CAN is in a respective ECU sleep mode.

6. The vehicle of claim 5, wherein the gateway module wakes up from the system sleep mode into a system active mode in response to one of the ECUs connected to the first of CAN buses activating.

7. The vehicle of claim 5, wherein a first of the CAN buses becomes inactive when the vehicle is in the off state and each of the ECUs connected to the first of the CAN buses has been in the respective ECU sleep mode for at least a predetermined period of time.

8. The vehicle of claim 1, further including an ignition control unit that detects a position of the ignition switch.

9. The vehicle of claim 1, further including a battery management system connected to the BCM, wherein the battery management system includes a battery sensor that is configured to measure the energy consumption measurements of the battery.

10. The vehicle of claim 9, wherein the gateway module collects the energy consumption measurements of the battery via the BCM and one of the CAN buses to which the BCM is connected when the corresponding one of the CAN buses is active.

11. The vehicle of claim 9, further including a local area network (LIN) that connects the BCM to the gateway module, wherein the gateway module is configured to collect the energy consumption measurements of the battery via the BCM and the LIN when the one of the CAN buses connected to the BCM is active or inactive.

12. The vehicle of claim 1, wherein the gateway module is configured to send the activation data and the energy consumption measurements to a remote server via a communication module when the vehicle is in the on state.

13. The vehicle of claim 1, wherein, the gateway module is configured to determine, based on the activation data and the energy consumption measurements, which of the ECUs is consuming a most amount of the battery when the vehicle is in the off state.

14. The vehicle of claim 13, wherein, in response to determining that at least one of the ECUs is draining the battery, the gateway module presents an alert to a user via an interface module when the vehicle is in the on state.

15. The vehicle of claim 1, wherein each of the ECUs is configured to:
    store corresponding activation data when the vehicle is in the off state; and
    send the corresponding activation data when the vehicle is in the on state.

16. A method for a vehicle including electronic control units (ECUs) and controller area network (CAN) buses, the method comprising:
    determining, via an ignition switch and a remote start system, that the vehicle is in an off state based on the ignition switch not being in an on position or a start position and the remote start system being inactive;
    sending, via the ECUs, messages to a gateway module when the ECUs are active and the vehicle is in the off state, the messages include time-stamped activation data, the gateway module configured to detect a source of battery drainage while the vehicle is in the off state;
    activating the CAN buses connected to the ECUs responsive to the ECUs activating;
    storing the activation data via the gateway module to monitor activity of the CAN buses;
    sending, via the ECUs, energy consumption measurements of a battery of the vehicle, the energy consumption measurements being subsequently time-stamped, when the vehicle is in the off state;
    correlating the time-stamped activation data and the energy consumption measurements that are subsequently time-stamped to facilitate identification of at least one of the ECUs that is consuming a most amount of energy of the battery when the vehicle is in the off state;

waking up the vehicle into an on state, wherein the ignition switch is not in the on position, or the start position,; and sending the time-stamped activation data and the energy consumption measurements to a remote server in response to detecting that the energy consumption measurements exceeds a threshold during a predefined period of time.

\* \* \* \* \*